United States Patent [19]

Hitotsuyanagi et al.

[11] Patent Number: 5,011,759
[45] Date of Patent: Apr. 30, 1991

[54] SEMICONDUCTOR ELEMENT AND METHOD OF FORMING SAME AND ARTICLE IN WHICH SAID ELEMENT IS USED

[75] Inventors: Hajime Hitotsuyanagi; Nobuhiko Fujita; Hideo Itozaki; Syoji Nakagama; Saburo Tanaka; Kazuhiko Fukushima, all of Itami, Japan

[73] Assignee: Sumitomo Electric Industries, Ltd., Osaka, Japan

[21] Appl. No.: 391,734

[22] Filed: Aug. 8, 1989

Related U.S. Application Data

[60] Division of Ser. No. 177,904, Apr. 1, 1988, abandoned, which is a continuation of Ser. No. 844,027, Mar. 25, 1986, abandoned.

[30] Foreign Application Priority Data

| Mar. 28, 1985 | [JP] | Japan | 60-65513 |
| Mar. 28, 1985 | [JP] | Japan | 60-65514 |
| Mar. 28, 1985 | [JP] | Japan | 60-65515 |
| Jun. 3, 1985 | [JP] | Japan | 60-120176 |

[51] Int. Cl.$^5$ .................. G03G 5/082; B05D 3/06
[52] U.S. Cl. .................. 430/128; 430/85; 136/258; 136/261; 357/2; 357/30; 357/31; 427/53.1; 427/54.1; 313/384
[58] Field of Search .............. 430/128; 427/53.1, 54.1

[56] References Cited

U.S. PATENT DOCUMENTS

| 4,581,249 | 4/1986 | Kamiya ............... 427/54.1 X |
| 4,585,671 | 4/1986 | Kitagawa et al. ........ 427/54.1 |

Primary Examiner—Roland Martin
Attorney, Agent, or Firm—Wenderoth, Lind & Ponack

[57] ABSTRACT

The present invention relates to a semiconductor element and a method of forming the same and various kinds of article in which said element is used.

Any material selected from the group consisting of $SiH_4$, $Si_2H_6$ and $SiF_4$, and $GeH_4$ or $GeF_4$, are used as raw material gases. $H_2$ is used as a diluent gas if necessary. A photochemical gas phase vapor deposition method is used, at a pressure of 0.1 to 20 Torr, an optical intensity of 10 to 1,000 mW/cm$^2$, and a substrate temperature of 50° to 250° C. A semiconductor element formed of a -SiGe:H film having superior photoelectric conductivity, a method of forming a semiconductor element film containing Ge added thereto and having high long wave length-sensitivity and superior film quality can be provided. In addition, various kinds of articles such as a solar cell having superior long wave length-sensitivity in which said element is used in a carrier-producing layer, an electrophotographic sensitive member containing said element in a carrier-producing layer, and an image sensor, in which said element is used in a carrier-producing layer, having superior long wave length-sensitivity, can be provided.

4 Claims, 2 Drawing Sheets

SEMICONDUCTOR ELEMENT AND METHOD OF FORMING SAME AND ARTICLE IN WHICH SAID ELEMENT IS USED

This application is a division of Ser. No. 07/177,904 filed Apr. 1, 1988, now abandoned, which is a continuation of Ser. No. 06/844,027 filed Mar. 25, 1986, now abandoned.

BACKGROUND OF THE INVENTION

Field of Industrial Use

The present invention relates to a semiconductor element having superior photoelectric conductivity produced by a photochemical gas phase vapor deposition method (hereinafter referred to as an photo CVD for short) and a method of forming the same and various kinds of article in which said element is used. (1) a solar cell having superior long wave length-sensitivity obtained by using said element in a carrier-producing layer; (2) an electrophotographic sensitive member containing said element in a carrier-producing layer; and (3) an image sensor having superior long wave length-sensitivity in which said element is used as a carrier-producing layer.

The present invention is below described in detail for every one of the above described articles. (Prior Art)

Electronic devices utilizing the photoelectromotive force effect are represented by a solar cell. The solar cell, which converts solar energy or other optical energies to electrical energy, is one of the technologies which are being watched with interest as one of countermeasures for energy in the future. The conversion of optical energy to electric energy by a solar cell utilizes the photoelectromotive force effect, which is one of the most fundamental properties of a hetero junction, a pn junction or a pin junction, a Shottkey junction and the like of a semiconductor. The photoelectromotive force effect makes progress in accordance with a mechanism that upon absorption of an incident ray, an electron hole pair is formed and taken out.

However, recently a hydrogenized amorphous silicon a-Si:H is being watched as a material of a thin layer solar cell with interest. This a-Si:H has interesting characteristics in that its absorption coefficient for a light having a wave length near the peak (500 nm) of a solar energy distribution is larger than that of crystalline Si by about one figure; its temperature, at which a thin film is formed, is lower than that of crystalline Si; a film can be directly formed from raw materials by a glow discharge decomposition; also the formation of a junction is easy; and the like.

The most important problem in the design and production of a solar cell is an achievement of a high conversion efficiency. In order to achieve the above described object, a large amount of research and development is being conducted.

Thus, recently an a-SiGe:H solar cell, in which an a-SiGe:H containing Ge added as an additive element is used as an i-layer, has been proposed. As to output characteristics of an a-SiGe:H single-layer solar cell, in which for example an a-SiGe:H film having an inhibit band width $E_g \simeq 1.4$ eV is used as an i-layer, a short-circuit current $J_{sc}$ was small to an extent of 9.0 mA/cm$^2$ and the long wave length-sensitivity was unsatisfactory.

Accordingly, in order to improve the conversion efficiency of an a-Si:H/a-SiGe:H tandem solar cell, it was necessary to improve the characteristics of an a-SiGe:H single-layer solar cell, which was a second layer solar cell, in particular $J_{sc}$ and the long wave length-sensitivity.

A-SiGe:H film produced by a glow discharge (hereinafter referred to as a GD for short) using SiH$_4$ gas and GeH$_4$ gas or a sputtering method has been used in a carrier-producing layer of a solar cell.

However, since these methods use plasma, a-SiGe:H film obtained by these methods has a disadvantage in that the film is injured by charged particles. In addition, a-SiGe:H film obtained by a GD method and a sputtering method has a disadvantage in that the photoelectric characteristics are suddenly reduced with an addition of Ge.

Furthermore, since the GD method requires GeH$_4$ gas at a ratio of GeH$_4$ to SiH$_4$ of 1 or less for the production of a-SiGe:H of 1.6 eV, it has been necessary to use a large amount of expensive GeH$_4$.

On the other hand, a photo CVD method, in which the injury of a film due to charged particles is reduced in comparison with that in the GD method, has been also used for the production of a-Si:H film, but the production of a-SiGe:H film by said method and the use of that film in a carrier-producing layer of a solar cell have not been known much.

Although, as above described in detail, a-Si has been watched with interest for a material of a thin film solar cell and extensively investigated in view of various kinds of interesting characteristics thereof, a-Si having a sufficient conversion efficiency has not been achieved yet and thus, the development of a practically suitable art has been eagerly desired.

For example, in the above described a-Si:H/a-SiGe:H tandem solar cell it seems to be necessary to improve the characteristics of an a-SiGe:H single-layer solar cell in particular. The reason why the conventional article of such kind is inferior in short-circuit current $J_{sc}$ and long wave length-sensitivity is that if a GeH$_4$ raw material gas volume rate ratio GeH$_4$/(GeH$_4$+SiH$_4$) is increased, an a-SiGe:H film having a reduced inhibit band width $E_g$ is produced. The reason for this seems to be the deterioration of the photoconductivity (at AM 1.0, 100 mW/cm$^2$) $\Delta\delta_{ph}$ and the dark conductivity $\delta_d$ due to the formation of electric defects in Ge. That is to say, it was necessary to give an a-SiGe:H film the reduced $E_g$ and the high long wave length-sensitivity and thus it was necessary that the above described $\Delta\delta_{ph}$ was about $10^{-4}$ ($\Omega$.cm)$^{-1}$ and $\delta_d$ was reduced to an extent of $10^{-8}$ to $10^{-9}$ ($\Omega$.cm)$^{-1}$.

In addition, photoconductors of inorganic type such as Se, CdS and ZnO or those of organic type such as polyvinylcarbazol have been used as electrophotographic sensitive members.

In view of the fact that a-Si has advantages in that (1) it is less poisonous than the conventional materials; (2) it is more heat resistant than the conventional materials: (3) it has surface hardness higher than that of the conventional materials; (4) it has sufficient sensitivity up to a long wave length range; and the like, the active researches and development of a-Si have been carried out in recent years.

In general, a glow discharge decomposition method has been used in the production of a-Si sensitive member. In this method SiH$_4$ or Si$_2$H$_6$ gas is subjected to a plasma decomposition in a high-frequency electric field to form an a-Si thin film on a substrate.

In order to give sensitivity up to a longer wave length range for use in a laser printer, attempts have been made to add Ge to a part or the whole of a carrier-producing layer.

This object can be achieved by using GeH$_4$ as a raw material gas in the above described GD method.

However, a Ge-contained layer obtained by the GD method has the following disadvantages:

(1) The sensitivity in a long wave length range, which is required for a sensitive member for use in a laser printer, can not be stably obtained.

(2) Even though long wave length sensitivity is possessed immediately after production, the sensitivity is reduced with an increase of the number for times of using the sensitive member.

The reason of such a reduction of the sensitivity of a sensitive member seems to be an increase of the density of the defect-level in a photoconductive layer due to the corona-charge, the exposure and the like.

Next, amorphous films formed of materials such as CdS.CdSe, Se.As.Te and Si have been used as carrier-producing layers of an image sensor.

However, with an image sensor using these amorphous films it is difficult to increase the reading speed to 10 ms/line or more.

Accordingly, recently an increase of the reading speed by using an a-Si:H film and an a-SiGe:H film as a carrier-producing layer has been investigated.

However, it is the production of such an a-Si:H film and an a-SiGe:H film by the GD method and the sputtering method using SiH$_4$ or Si$_2$H$_6$ or a mixture of GeH$_4$ gas and SiH$_4$ or Si$_2$H$_6$ that has been investigated.

However, since said methods all use plasma, an a-SiGe:H film obtained by these methods has a disadvantage in that the film is injured by charged particles.

SUMMARY OF THE INVENTION

The present inventors have achieved the present invention by finding that if an a-SiGe:H film having superior photoelectric conductivity, whose injury by charged particles is reduced, is used as a carrier-producing layer of a solar cell, a solar cell having superior long wave length-sensitivity can be obtained.

Thus, it is an object of the present invention to provide a method of forming an a-SiGe:H thin film which has a reduced number of defects and is superior in J$_{sc}$ and long wave length-sensitivity characteristic.

It is also one object of the present invention to provide an a-Si:H/a-SiGe:H tandem solar cell having a high conversion efficiency.

The present inventors found from various kinds of investigation and research aimed at the elimination of the above described many kinds of defects incidental to an a-Si thin film solar cell, that the utilization of a photo CVD method in the film formation and the dilution of film-forming raw material gases with hydrogen were remarkably advantageous for the improvement of film quality, and thus achieved the present invention.

That is to say, a method of forming an a-SiGe:H film according to the present invention is an improved method of forming an a-SiGe:H film obtained by adding Ge to an a-Si:H film and characterized by that hydrogen is added to raw material gases containing an additive source at the following ratios and a thin film is formed by a photochemical gas phase vapor deposition (photo CVD) method.

Useful raw material gases in a method according to the present invention include SiH$_4$, Si$_2$H$_6$ or SiF$_4$ or mixtures thereof. On the other hand, raw materials for Ge as an additive element include GeH$_4$ or GeF$_4$ or mixtures thereof.

It is necessary to add hydrogen at such a ratio that the following relation holds good in the dilution of the above described raw material gases with hydrogen:

$$0.25 \leq H_2/(Ge\ source + Si\ source + H_2) \leq 0.60$$

Either a mercury-sensitized method or a direct-exciting method can be used in a photo CVD method which is advantageous in the present invention. For example, an apparatus as shown in FIG. 3 can be used to form a thin film. In said apparatus ultraviolet rays radiated from a light source 14 excite and activate raw material gases and hydrogen gas charged in a reaction chamber 15 and simultaneously promote the decomposition and the reaction. The desired thin film 18 is deposited on a substrate 17 heated by a heater 16, which is also supported in the reaction chamber 15, to obtain the objective a-SiGe:H film.

In a method according to the present invention ultraviolet rays having wave lengths of 0.3 μm or less are particularly useful. Ultraviolet rays may be collected by means of a lens and the like.

That is to say, the present invention aims at the provision of an a-SiGe:H film having superior photoelectric conductivity produced by a photo CVD method. Any material selected from the group consisting of SiH$_4$, Si$_2$H$_6$ and SiF$_4$ and GeH$_4$ or GeF$_4$ are used as raw material gases, or also boron (B) being added, H$_2$ being used as a diluent gas if necessary. The film is formed under the conditions that the pressure is 0.1 to 20 Torr, the optical intensity is 10 to 500 mW/cm$^2$, and the substrate temperature is 150° to 250° C. The invention also provides a solar cell having superior long wave length-sensitivity in which said a-SiGe:H film is used as a carrier-producing layer.

In addition, as to an electrophotographic sensitive member, the present invention provides a sensitive member comprising a carrier-producing layer having stabilized long wave length-sensitivity, based on the finding that an a-SiGe:H sensitive member produced by the photo CVD method has remarkably superior characteristics.

That is to say, the present invention provides an electrophotographic sensitive member, in which an a-SiGe:H film having superior photoelectric conductivity is used as a carrier-producing layer. This film is obtained by a photo CVD method in which any material selected from the group consisting of SiH$_4$, Si$_2$H$_6$ and SiF$_4$ and GeH$_4$ or GeF$_4$ are used as raw material gases, H$_2$ being used as a diluent gas if necessary, and the film being formed under the conditions that the pressure is 0.1 to 10 Torr, the optical intensity is 100 to 1,000 mW/cm$^2$, and the substrate temperature is 50° to 250° C.

In addition, as to an image sensor, the present invention was achieved by finding that if an a-SiGe:H film having superior photoelectric conductivity, whose injury by charged particles was reduced, is used as a carrier-producing layer of an image sensor, an image sensor having superior long wave length-sensitivity can be obtained.

That is to say, the present invention provides an image sensor having superior long wave length-sensitivity, in which an a-SiGe:H film having superior carrier-producing layer is used as a photoelectric conversion element. The film is obtained by a photo CVD method in which any material selected from the group consisting of SiH$_4$, Si$_2$H$_6$ and SiF$_4$ and GeH$_4$ or GeF$_4$ are used as raw material gases, or also boron (B) being added, H$_2$ being used as a diluent gas if necessary, and the film being formed under the conditions that the pressure is 0.1 to 15 Torr, the optical intensity is 10 to 200 mW/cm$^2$, and the substrate temperature is 150° to 250° C.

BRIEF DESCRIPTION OF THE DRAWINGS

The present invention will be described with reference to the accompanying drawings, in which.

DETAILED DESCRIPTION OF THE INVENTION

It is important in the production of an a-Si:H/a-SiGe:H tandem solar cell to improve the conversion efficiency. To this end, the short-circuit current J$_{sc}$ and the long wave length-sensitivity of an a-SiGe:H single-layer solar cell must be improved, as above described. Although the reason for this seems to be that $\Delta\delta_{ph}$ and $\delta_d$ are deteriorated due to the existence of Ge as an additive element, a large number of dangling bonds, i.e. states, in which bonds are broken, exist in an a-SiGe:H film and they seem to act as defects of the thin film.

Thus, in a method according to the present invention hydrogen was added to raw material gases in the film-forming process to terminate said dangling bonds with H, whereby remarkably reducing a local level and being capable of improving a film quality.

If raw material gases are diluted in accordance with a method according to the present invention, said dangling bonds are reduced, whereby the local level is remarkably reduced, so that $\delta_d$ can be reduced without reducing $\Delta\delta_{ph}$ and as a result, an a-SiGe:H film, which is superior in film quality, can be obtained even when E$_g$ is nearly 1.4 eV.

In a method according to the present invention the quantity of hydrogen added is critical and the ratio H$_2$/(Ge source+Si source+H$_2$) must exist in a range of 0.25 to 0.60. That is to say, if said ratio is less than 0.25 the quantity of hydrogen is insufficient and the termination of dangling bonds with hydrogen becomes insufficient, thereby being incapable of obtaining an a-SiGe:H film, which is superior in film quality, while if said ratio is more than 0.6, the quantity of hydrogen gas is too large and as a result, the columnar of the film appears and $\delta_d$ is too increased, thereby being incapable of using it as an i-layer. Accordingly, both said ratio of less than 0.25 and more than 0.6 must be avoided.

Figure 1:
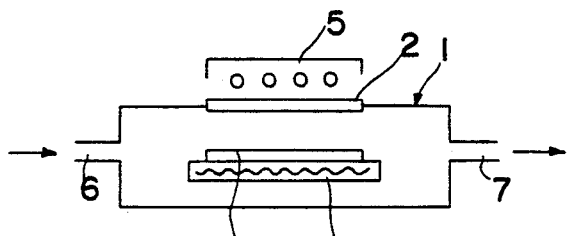
FIG. 1 is a diagram showing one example of an apparatus for producing an a-SiGe:H film obtained as a semiconductor element in the present invention.

One example of the production of an a-SiGe:H film used in a carrier-producing layer of a solar cell according to the present invention is below described. General photo CVD apparatus may be used and one example of the apparatus is shown in FIG. 1.

1 designates a reaction tank provided with a silica glass window 2 on the upper surface thereof, a substrate 3 being mounted on a substrate-heating heater 4 at a position corresponding to the silica glass window 2 in said reaction tank 1. And, the silica glass window 2 is provided with an ultra-violet lamp 5 mounted on the upper portion thereof. A mixture gas of SiH$_4$ or Si$_2$H$_6$ as a raw material of Si and GeH$_4$ or GeF$_4$ as a raw material of Ge is introduced into the reaction tank of the apparatus having such a construction through a raw material gas-introducing port 6. At this time, also mercury vapor may be added if necessary. The inside of the reaction tank is preferably maintained at 0.1 to 20 Torr by means of a vacuum pump. An exhaust gas is discharged through an exhaust port 7.

The reason why the pressure within the reaction tank is maintained at 0.1 to 20 Torr is that if the pressure less than 0.1 Torr, the gas is rarefield, thereby remarkably reducing the film-forming speed, while if the pressure is more than 20 Torr, ultraviolet rays are absorbed by the gas, thereby hindering the arrival of ultraviolet rays onto the substrate and undesirably remarkably reducing the film-forming speed.

In addition, the reason why the optical intensity is 10 to 500 mW/cm$^2$ is that if the optical intensity less than 10 mW/cm$^2$, it is too small, thereby also reducing the film-forming speed, while if the optical intensity more than 500 mW/cm$^2$, it is too large, thereby also increasing the film-forming speed and deteriorating the film characteristics.

Furthermore, the reason why a substrate temperature of 150° to 250° C. is preferably selected when heated less than that if the substrate temperature is 150° C. the film quality (photoelectric conductivity) is deteriorated while if the substrate temperature more than 250° C., hydrogen is left out, thereby reducing the hydrogen content and producing a film having a large number of defects and bad qualities.

The addition of boron (B) to the raw materials at a ratio of 10$^{15}$ to 10$^{19}$ atoms/cc leads to an improvement in long wave length-sensitivity of the solar cell.

As described above, since plasma is not used in the present invention, the injury of a film by electrons and ions in plasma as in the conventional methods does not occur, thereby the advantages such as a reduced extent of the reduction of photoelectric conductivity and a higher efficiency of the addition of Ge in comparison with the conventional methods are exhibited.

According to the present invention, an a-SiGe:H thin film, which is superior in film quality as above described, can be advantageously formed and such a thin film is useful in the production of an a-Si:H/a-SiGe:H tandem solar cell. Although a method according to the present invention has been described with adopting a solar cell as an example for simplification, the method according to the present invention is useful also in producing a sensitive member, a sensor and the like in which an a-SiGe:H thin film is used.

In addition, since a photo CVD method is adopted in the formation of a film, the injury of the film by high-energy charged particles is reduced in comparison with a GD method, thereby being capable of obtaining an a-SiGe:H film which is superior in film quality.

A photo CVD is a method for forming a film by radiating ultraviolet rays and the like to the reaction gases and decomposing by an optically excited reaction to form a film. And, this method is divided into two methods: a mercury-sensitized method, in which the reaction gases are preliminarily intensified by Hg and a direct exciting method in which the reaction gases are directly excited optically.

Comparing this photo CVD method with a GD method, since the photo CVD method is a system in which plasma does not exist, the injury by high-energy ions, the contamination and the like of the film are not observed. Accordingly, the formation of a film having quality higher than that in the GD method can be expected.

The present inventors found from the results of the application of an a-SiGe:H film produced by the present invention to a sensitive member that superior performances could be achieved with respect to all of the characteristics of the sensitive member as described below.

Figure 2:
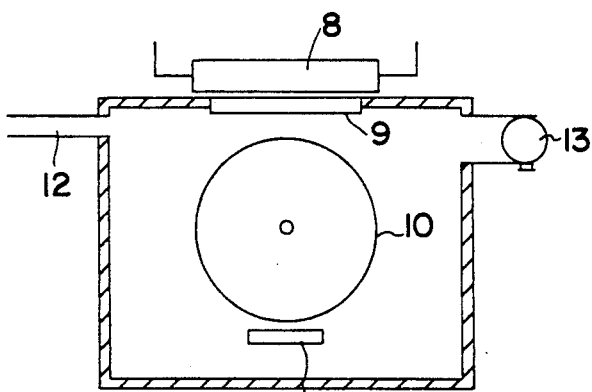
FIG. 2 is a schematic diagram showing one example of an apparatus for producing an a-SiGe:H sensitive member by a photo CVD method.
Figure 3:
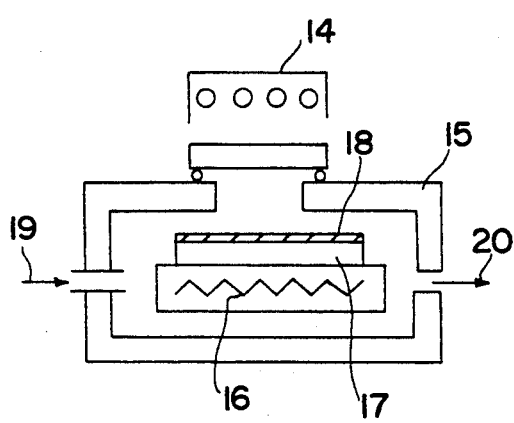
FIG. 3 is a schematic diagram showing another example of an apparatus for producing an a-SiGe:H film.

Referring then to FIG. 2 which is a schematic diagram showing another example of apparatus used for the production of an a-SiGe:H sensitive member by the photo CVD method, 8 designates a light source, 9 designating a window, 10 designating a substrate drum, 11 designating a heater, and 12 designating a gas-introducing port. And, a mixture gas of $SiH_4$ or $Si_2H_6$ and $GeH_4$ is introduced through the gas-introducing port 12.

A pressure within the apparatus at this time is preferably about 0.1 to 10 Torr.

The reason for this is that if the pressure is less than 0.1 Torr or more than 10 Torr, this film-forming speed is too small to achieve the high-speed film formation.

A low-pressure mercury lamp, a heavy hydrogen lamp, the Exima laser and the like may be used as a light source and an optical intensity is preferably 100 to 1,000 $mW/cm^2$ in view of an increase of the film-forming speed. The reason why the optical intensity of 100 to 1,000 $mW/cm^2$ is preferably selected is that if the optical intensity less than 100 $mW/cm^2$, the film-forming speed is small, while if the optical intensity is more than 1,000 $mW/cm^2$, the film characteristics are deteriorated.

Electrically conductive materials such as Al, Ni and stainless steel and high molecular materials such as polyimide having electric conductance on a surface thereof are preferably used as a substrate. The substrate is rotatably driven by a motor.

A heater is used to heat the substrate. If a substrate temperature is 50° C. or less, the film quality is deteriorated, thereby being incapable of use in a sensitive member, while if the substrate temperature is more than 250° C., hydrogen in the film is left off, whereby the film quality is deteriorated. Therefore the substrate temperature is preferably 50° to 250° C.

Thus, according to the results of the application of an a-SiGe:H film produced by the present invention to a sensitive member, various advantages occur in the following points:

(1) A sensitive member having sufficient sensitivity up to a long wave length range can be obtained by producing an a-SiGe:H film layer by the present invention.

The reason for this is that since the photo CVD method does not use plasma, the injury of the film by high-energy ions does not occur, and since impurities are not taken in the film from an inside wall of the apparatus, a defect-level is not produced in the film.

(2) An a-SiGe:H film having the stabilized long wave length-sensitivity can be produced. The reason for this is that it is necessary only to make the exposure strength uniform in order to stably form a film in the photo CVD method.

(3) A sensitive member does not deteriorate in sensitivity even after a continuous operation for a long time.

(4) Since an a-SiGe:H film has high surface hardness, it can be used as a surface layer of a sensitive member.

Describing one example of the production of an a-SiGe:H film used as a carrier-producing layer in an image sensor according to the present invention, general photo CVD apparatus may be used. An apparatus shown in FIG. 1 is one example of those general photo CVD apparatus, as in the above described solar cell.

And, a pressure within the reaction tank 1 is preferably maintained at 0.1 to 15 Torr and the optical intensity is preferably maintained at 10° to 200 $mW/cm^2$.

EXAMPLES

The present invention will be below described with reference to Examples.

EXAMPLE 1

Figure 4:
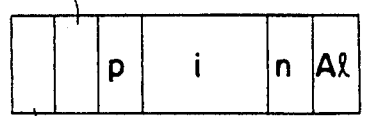
FIG. 4 is a diagram showing a construction of a single-layer type solar cell.

A solar cell, which is superior in long wave length-sensitivity, was produced by using an a-SiGe:H film obtained according to the present invention as an i-layer in a solar cell constructed as shown in FIG. 4.

In addition, all of a p-layer, a n-layer and an i-layer shown in FIG. 4 were produced by a photo CVD method using a mercury intensification.

Raw material gases, volume rates of gases, film-forming times and the like are as follows:

| Raw material gases | Volume rate | Film-forming time |
|---|---|---|
| 100% $SiH_4$ gas | 20 sccm | 2 minutes |
| 500 ppm $B_2H_6$ gas | 30 sccm | |
| 10% $GeH_4$ gas (the remainder: 90% $H_2$) | 10 sccm | 85 minutes |
| 100% $SiH_4$ gas | 100 sccm | |
| 10 ppm $B_2H_6$ gas | 20 sccm | |
| 100% $SiH_4$ gas | 20 sccm | 11 minutes |
| 1,000 ppm $PH_3$ gas | 21 sccm | |

In addition, $B_2H_6$ and $PH_3$ contain hydrogen as a main ingredient. The film formation in a photo CVD apparatus, which is shown in FIG. 1 as one example, was carried out for the above described film-forming time under the conditions of a film-forming pressure of 5 Torr, a substrate temperature of 180° C., and a temperature of photoreaction-intensifying mercury of 60° C. using a low pressure mercury lamp as a light source for each of a p-layer, a n-layer and an i-layer.

The characteristics of a solar cell produced under the above described conditions were as follows under solar rays having AM of 1.5 and 100 mW/cm$^2$:

| | |
|---|---|
| Short-circuit current | 13.3 mA/cm$^2$ |
| Open voltage | 0.72 V |
| Fill factor | 52% |
| Conversion efficiency | 5% |

Figure 5:
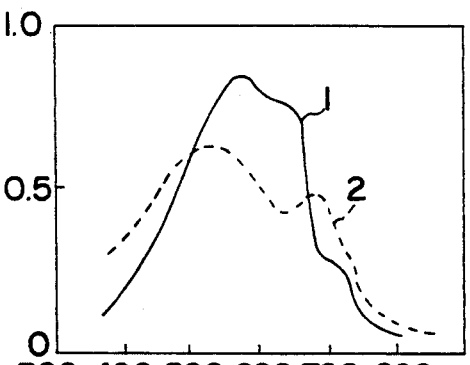
FIG. 5 is a graph showing spectral sensitivity characteristics of an a-SiGe solar cell.

In addition, a spectrometric sensitivity of the resulting solar cell is shown by a graph ① in FIG. 5. A solar cell having a sensitivity in a long wave length range was obtained. A graph ② in FIG. 5 shows a spectrometric sensitivity of a solar cell in which an a-Si:H film (p, n layers) and an a-SiGe:H film (i-layer) produced by the conventional glow discharge method.

It was found from FIG. 5 that a solar cell according to the present invention had a remarkably high sensitivity at 500 to 650 nm.

Figure 6:
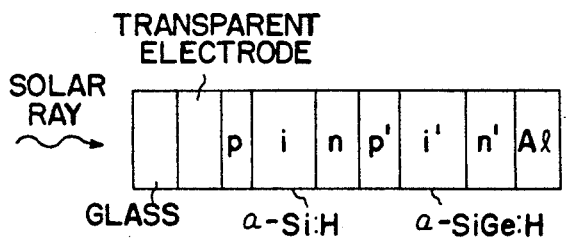
FIG. 6 is a diagram showing a construction of a double-layer type solar cell.

Next, a solar cell of double-layer type construction as shown in FIG. 6, in which an a-Si:H layer produced by the conventional glow discharge method was used as an i'-layer, and that, in which an a-SiGe:H layer produced by a photo CVD method according to the present invention was used as an i'-layer, were produced.

The resulting solar cells had characteristics as shown in Table 1.

TABLE 1

| | Characteristics | Conversion efficiency |
|---|---|---|
| Conventional method (glow discharge) | Insufficient long wave length sensitivity | 1% |
| Present invention (photo CVD) | Sufficient long wave length sensitivity | 5% |

Figure 7:
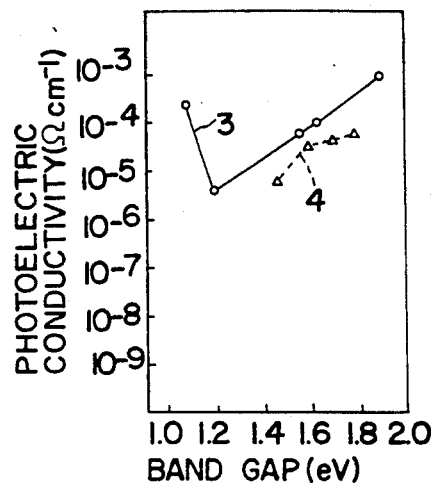
FIG. 7 is a graph showing the dependency of optical characteristics upon band gaps.

In addition, the dependency of photoelectric characteristics of an a-SiGe:H film ③ produced by a photo CVD method according to the present invention and an a-SiGe:H film ④ produced by the conventional glow discharge method upon band gaps are shown in FIG. 7. It was found from FIG. 7 that a film produced by a photo CVD method according to the present invention showed photoelectric characteristics higher than those of a film produced by the conventional glow discharge method over the band gap range from 1.4 eV to 1.8 eV.

EXAMPLE 2

An electrically conductive substrate produced by forming an Al layer on polyimide by sputtering was wound around a drum of, for example, a photo CVD apparatus as shown and then a blocking layer, a carrier-producing layer and a surface layer were formed in this order by a mercury-sensitized method using ultraviolet rays under the conditions as shown in the following Table 2 to produce a sensitive member.

TABLE 2

| Conditions | Blocking layer | Carrier-producing layer | Surface layer |
|---|---|---|---|
| Film-forming gases and volume rates thereof | Si$_2$H$_6$ 100 SCCM (100%) | Si$_2$H$_6$ 200 SCCM (100%) GeH$_4$ 50 SCCM (10%) | Si$_2$H$_6$ 100 SCCM (100%) |
| | N$_2$ 100 SCCM | B$_2$H$_6$ 100 SCCM (100 ppm) | N$_2$ 100 SCCM |
| Pressure | 2 Torr | 5 Torr | 2 Torr |
| Substrate temperature | 100° C. | 200° C. | 100° C. |
| Light source | Low-pressure mercury lamp (500 mW/cm$^2$) | | |
| Thickness | 500Å | 2 μm | 500Å |

After electrifying at −6 kV, a sensitive member produced under the conditions as shown in the above Table was tested on a receipt potential, a dark attenuation (a time until a receipt potential is reduced to ½), a photosensitivity (at a wave length of 780 nm), a residual potential (after 2 seconds since start of the radiation of light) and the like with the results as shown in Table 3.

TABLE 3

| Receipt potential (V) | Dark attenuation (sec) | Photosensitivity (erg/cm$^2$) | Residual potential (V) |
|---|---|---|---|
| (1) −250 | 20 | 3 | −2 |
| (2) −240 | 18 | 5 | −3 |

(1) shows an initial value while (2) shows a value after the repetition of 10$^5$ times of electrification and exposure.

COMPARATIVE EXAMPLE

A substrate similar to Example 2 was subjected to a glow discharge under the conditions as shown in the following Table 4 to produce a sensitive member.

TABLE 4

| Conditions | Blocking layer | Carrier-producing layer | Surface layer |
|---|---|---|---|
| Film-forming gases and volume rates thereof | Si$_2$H$_6$ 100 SCCM (100%) | Si$_2$H$_6$ 100 SCCM (100%) GeH$_4$ 25 SCCM (10%) | Si$_2$H$_6$ 100 SCCM (100%) |
| | N$_2$ 100 SCCM | B$_2$H$_6$ 5 SCCM (10 ppm) | N$_2$ 100 SCCM |
| Pressure | 0.15 Torr | 0.2 Torr | 0.15 Torr |
| Substrate temperature | 200° C. | 200° C. | 200° C. |

TABLE 4-continued

| Conditions | Blocking layer | Carrier-producing layer | Surface layer |
|---|---|---|---|
| High-frequency output (13.56 MHz) | 200 W | 200 W | 200 W |
| Thickness | 500Å | 2.2 μm | 500Å |

Next, a sensitive member produced under the above conditions was tested on a receipt potential, a dark attenuation and the like in the same manner as in Examples with the results as shown in Table 5.

TABLE 5

| Receipt potential (V) | Dark attenuation (sec) | Photosensitivity (erg/cm²) | Residual potential (V) |
|---|---|---|---|
| (1) −240 | 15 | 20 | 2 |
| (2) −100 | 10 | 100 | 20 |

EXAMPLE 3

Figure 8:
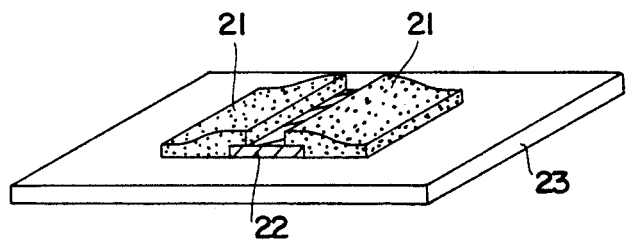
FIG. 8 is a diagram showing one example of a sensor portion constructing an image sensor according to the present invention.

FIG. 8 is a diagram showing one of sensor portions constructing an image sensor. Sensor portions having such a construction are arranged in one dimension or two dimensions to form an image sensor. Referring to FIG. 8, 21 designates a metallic electrode, 22 designating an a-SiGe:H film according to the present invention, and 23 designating a substrate. And, an a-SiGe:H film was formed from a raw material gas comprising 100% $SiH_4$ gas at a ratio of 100 sccm, 10 ppm $B_2H_6$ gas (containing hydrogen as a main ingredient) at a ratio of 20 sccm and 10% $GeH_4$ gas (containing hydrogen as a main ingredient) at a ratio of 20 sccm under the following conditions:

| Film-forming time | 85 minutes |
|---|---|
| Light source | low-pressure mercury lamp |
| Mercury temperature | 60° C. |
| Substrate temperature | 180° C. |
| Film-forming pressure | 5 Torr |

The resulting a-SiGe:H film was used as a carrier-producing layer to obtain an image sensor.

The resulting image sensor was improved in photosensitivity characteristic at wave lengths of 700 to 900 nm by 5 to 50 times in comparison with an image sensor produced by the conventional glow discharge method.

EXAMPLE 4

Figure 9:
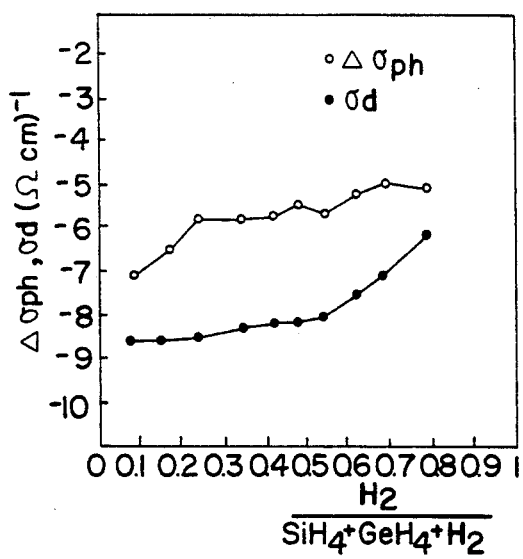
FIG. 9 is a graph showing a relation between $\Delta\sigma_{ph}$ and $\sigma_d$ of an a-SiGe:H film obtained by a method according to the present invention and a dilution ratio of raw material gases with hydrogen H$_2$/(GeH$_4$+SiH$_4$+H$_2$)

$SiH_4$ is used as a raw material gas and $GeH_4$ as a source of Ge which is an additive element. The gas volume rate ratio $GeH_4/(GeH_4+SiH_4)$ was maintained at 0.4. On the other hand, a photo CVD method (mercury-sensitized method) is used while changing the ratio $H_2/(GeH_4+SiH_4+H_2)$ by adding hydrogen to said raw material gas mixture to form an a-SiGe:H film. The film formation was carried out under the conditions that an intensifying mercury temperature is 60° C., a total gas volume rate being 30 to 70 sccm, and a substrate temperature being 160° C. The resulting thin film was tested on $\Delta\sigma_{ph}$ and $\sigma_d$ with the results as shown in FIG. 9. $\Delta\sigma_{ph}$ and $\sigma_d$ were measured under the condition that an Al electrode was vacuum deposited in a gap type manner.

Figure 10:
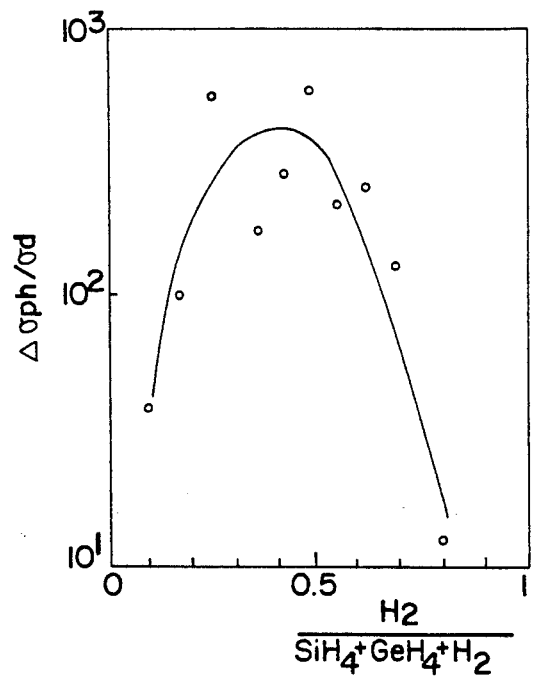
FIG. 10 is a graph showing a relation between $\Delta\sigma_{ph}/\sigma_d$ of an a-SiGe:H film obtained by a method according to the present invention and a dilution ratio of raw material gases with hydrogen H$_2$/(GeH$_4$+SiH$_4$+H$_2$).

As obvious from FIG. 10 obtained from the results as shown in FIG. 9, a ratio $\Delta\sigma_{ph}/\sigma_d$ is large in a range of a ratio $H_2/(GeH_4+SiH_4+H_2)$ from 0.25 to 0.60 and a film, which is superior in photosensitivity, can be obtained.

Effects of the Invention

As described above, according to a method of forming an a-SiGe:H thin film according to the present invention, since dangling bonds can be terminated by diluting raw material gases for forming an a-SiGe:H film with hydrogen in the appointed range of ratio, and the film is formed by a photo CVD method, the ratio $\Delta\delta_{ph}/\delta_d$ is increased, thereby being capable of obtaining an a-SiGe:H thin film which is superior in photosensitivity.

Accordingly, an a-Si:H/a-SiGe:H tandem solar cell requiring an a-SiGe:H film, which has lower Eg and higher long wave length-sensitivity, as an i-layer, can be obtained and its conversion efficiency also can be remarkably improved.

In addition, a method according to the present invention can be advantageously applied for the formation of a thin film in other various kinds of sensitive member, sensor and the like.

In addition, it is obvious that according to the present invention, since an a-SiGe:H film having a superior photoelectric conductivity produced by the present invention is used as an i-layer, a solar cell, which is superior in long wave length-sensitivity, can be obtained and an electrophotographic sensitive member can be improved in long wave length-sensitivity, fatigue phenomenon and the like. In addition, a sample obtained by a photo CVD method was developed by using toners having ⊖ change with excellent images even after $10^5$ times of operation.

Also in an image sensor, since an a-SiGe:H film, which is superior in photoelectric conductivity, was used as a carrier-producing layer, it was remarkably superior in photosensitivity characteristic.

An a-SiGe:H film according to the present invention can be used for not only an image sensor utilizing a photoconductive effect but also other image sensors of photo diode type using a Shottkey junction, a pin junction, a pn junction and the like.

What is claimed is:

1. A method of forming an a-SiGe:H film, which can be used in semiconductor elements, which comprises forming a film by a mercury-sensitized photochemical gas phase vapor deposition method with ultraviolet rays having wavelengths of 0.3 μm or less as a light source, wherein a member selected from the group consisting of $SiH_4$, $Si_2H_6$ and $SiF_4$, together with $GeH_4$ or $GeF_4$, are used as raw material gases and are introduced with hydrogen as a diluent gas into a film-forming chamber so that a volume ratio of the hydrogen gas to the total gas volume is within the range of 0.25 to 0.60, and the film being formed under the conditions of a film-forming pressure of 0.1 to 20 Torr, an intensity of the ultraviolet rays of 10 to 500 mW/cm², and a substrate temperature of 150° to 250° C.

2. A method according to claim 1, wherein the semiconductor element is a solar cell.

3. A method according to claim 1, wherein the semiconductor element is an electrophotographic sensitive member.

4. A method according to claim 1, wherein the semiconductor element is an image sensor.

* * * * *